(12) United States Patent
Lee et al.

(10) Patent No.: US 11,145,727 B2
(45) Date of Patent: Oct. 12, 2021

(54) SEMICONDUCTOR STRUCTURE AND METHOD OF FORMING THE SAME

(71) Applicant: NANYA TECHNOLOGY CORPORATION, New Taipei (TW)

(72) Inventors: Sheng-Hwa Lee, Changhua County (TW); Hsiu-Ming Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 57 days.

(21) Appl. No.: 16/667,893

(22) Filed: Oct. 29, 2019

(65) Prior Publication Data

US 2021/0126095 A1    Apr. 29, 2021

(51) Int. Cl.
| | |
|---|---|
| H01L 29/417 | (2006.01) |
| H01L 29/40 | (2006.01) |
| H01L 21/762 | (2006.01) |
| H01L 29/423 | (2006.01) |
| H01L 21/8234 | (2006.01) |
| H01L 29/51 | (2006.01) |
| H01L 29/66 | (2006.01) |
| H01L 29/49 | (2006.01) |

(52) U.S. Cl.
CPC .. *H01L 29/41766* (2013.01); *H01L 21/76224* (2013.01); *H01L 21/823468* (2013.01); *H01L 21/823481* (2013.01); *H01L 29/401* (2013.01); *H01L 29/41775* (2013.01); *H01L 29/4232* (2013.01); *H01L 29/42356* (2013.01); *H01L 29/4991* (2013.01); *H01L 29/515* (2013.01); *H01L 29/6656* (2013.01)

(58) Field of Classification Search
CPC ........... H01L 29/41766; H01L 29/4232; H01L 29/42356; H01L 29/515; H01L 29/6656; H01L 21/76224; H01L 21/823481
See application file for complete search history.

(56) References Cited

U.S. PATENT DOCUMENTS

| | | | | |
|---|---|---|---|---|
| 9,406,675 | B1 * | 8/2016 | Wu | .......... H01L 21/28088 |
| 2012/0104500 | A1 * | 5/2012 | Cai | ............ H01L 21/823468 |
| | | | | 257/368 |
| 2013/0069162 | A1 * | 3/2013 | Lin | .................... G06F 30/00 |
| | | | | 257/368 |
| 2019/0067306 | A1 * | 2/2019 | Fang | ............. H01L 21/76834 |
| 2020/0219989 | A1 * | 7/2020 | Cheng | ............... H01L 29/515 |

OTHER PUBLICATIONS

Martin L. Hammond et al., "Silicon Epitaxy by Chemical Vapor Deposition" Chapter 2-3 (pp. 45-150), Handbook of Thin Film Deposition Processes and Techniques Principles, Methods, Equipment and Applications, Second Edition, Y2002.

* cited by examiner

*Primary Examiner* — Joseph C. Nicely
(74) *Attorney, Agent, or Firm* — CKC & Partners Co., LLC

(57) ABSTRACT

A semiconductor structure includes a pair of active regions, a first isolation structure, a gate structure, and a pair of contacts. The first isolation structure is disposed between the active regions. The gate structure is disposed on the first isolation structure. The contacts are respectively disposed on the active regions. Each of the contacts has a bottom surface and a sidewall substantially perpendicular to the bottom surface.

12 Claims, 9 Drawing Sheets

SEMICONDUCTOR STRUCTURE AND METHOD OF FORMING THE SAME

BACKGROUND

Technical Field

The present disclosure relates to a semiconductor structure and a method of forming the semiconductor structure.

Description of Related Art

With the rapid growth of electronic industry, the development of integrated circuits (ICs) has achieved high performance and miniaturization. Technological advances in IC materials and design have produced generations of ICs where each generation has smaller and more complex circuits than the previous generation.

Contacts are used to make connections in or among different features in a semiconductor structure. A contact, for example, is used to connect one metal structure to another metal structure, where the metal structures are otherwise electrically isolated from one another, such as by an insulating or dielectric material separating the metal structures. However, recesses of an etching process are formed non-uniformly. As a result, the contacts are formed non-uniformly in the recess in a following process, thereby causing lower through-put of the contacts.

SUMMARY

According to one embodiment of the present disclosure, a semiconductor structure includes a pair of active regions, a first isolation structure, a gate structure, and a pair of contacts. The first isolation structure is disposed between the active regions. The gate structure is disposed on the first isolation structure. The contacts are respectively disposed on the active regions. Each of the contacts has a bottom surface and a sidewall substantially perpendicular to the bottom surface.

In some embodiments of the present disclosure, the contacts are respectively in contact with the active regions.

In some embodiments of the present disclosure, each of the active regions has a top surface and a sidewall substantially perpendicular to the top surface.

In some embodiments of the present disclosure, the bottom surface and the sidewall of each of the contacts are respectively conformal with the top surface and the sidewall of each of the active regions.

In some embodiments of the present disclosure, the semiconductor structure further includes a second isolation structure. One of the active regions is disposed between the first isolation structure and the second isolation structure, and the second isolation structure has a curved top surface adjoining the top surface of the active regions.

In some embodiments of the present disclosure, the semiconductor structure further includes a first spacer, a second spacer, and a gap. The first spacer and the second spacer are disposed between the gate structure and one of the contacts. The gap is disposed between the first spacer and the second spacer.

In some embodiments of the present disclosure, the second spacer is disposed on one of the active regions.

In some embodiments of the present disclosure, the semiconductor structure further includes a bit line contact, a dielectric structure, and a metal structure. The bit line contact is disposed below the gate structure. The dielectric structure is disposed between the bit line contact and the gate structure. The metal structure is disposed between the dielectric structure and the gate structure.

In some embodiments of the present disclosure, a top surface of each of the contacts is higher than a bottom surface of the gate structure.

In some embodiments of the present disclosure, each of the active regions has a top portion with a step profile, and the bottom surfaces of the contacts are lower than top surfaces of the top portions of the active regions.

In some embodiments of the present disclosure, the bottom surfaces of the contacts are lower than a bottom surface of the bit line contact.

In some embodiments of the present disclosure, the sidewalls and the bottom surfaces of the contacts have crystal orientations <100>.

In some embodiments of the present disclosure, the contacts comprise phosphorus dopants.

According to one embodiment of the present disclosure, a method of forming a semiconductor structure includes following steps. A first isolation is formed between a pair of active regions. A gate structure is formed on the first isolation structure. The active regions are etched to form recesses with curved top surfaces. The active regions are etched again to change each of the curved top surfaces to be a top surface and a sidewall substantially perpendicular to the top surface. A pair of contacts is formed respectively on the active regions, such that each of the contacts has a bottom surface and a sidewall substantially perpendicular to the bottom surface.

In some embodiments of the present disclosure, the method of forming the semiconductor structure further includes performing a clean treatment on the top surfaces and the sidewalls of the active regions before forming the contacts.

In some embodiments of the present disclosure, the method of forming the semiconductor structure further includes forming a second isolation structure such that one of the active regions is between the first and second isolation structures.

In some embodiments of the present disclosure, the method of forming the semiconductor structure further includes etching the second isolation structure such that second isolation structure has a recess with a curved top surface.

In some embodiments of the present disclosure, etching the active regions again to change each of the curved top surfaces is performed by wet etching.

In the aforementioned embodiments, since each of the contacts of the semiconductor structure has a bottom surface and a sidewall substantially perpendicular to the bottom surface, higher growth rate can be achieved and the contacts can be uniformly formed on the active regions. As a result, high through-put of the contacts can be achieved and the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
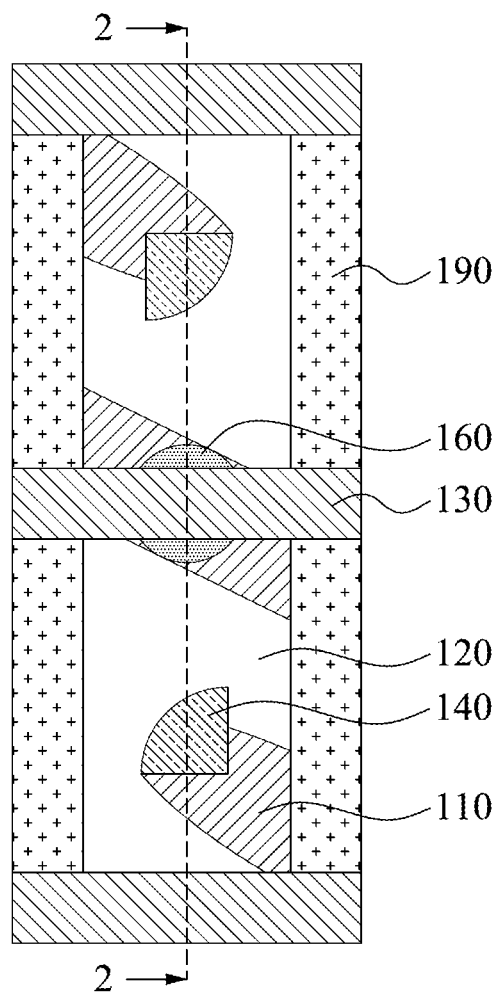
FIG. 1 is a top view of a semiconductor structure in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
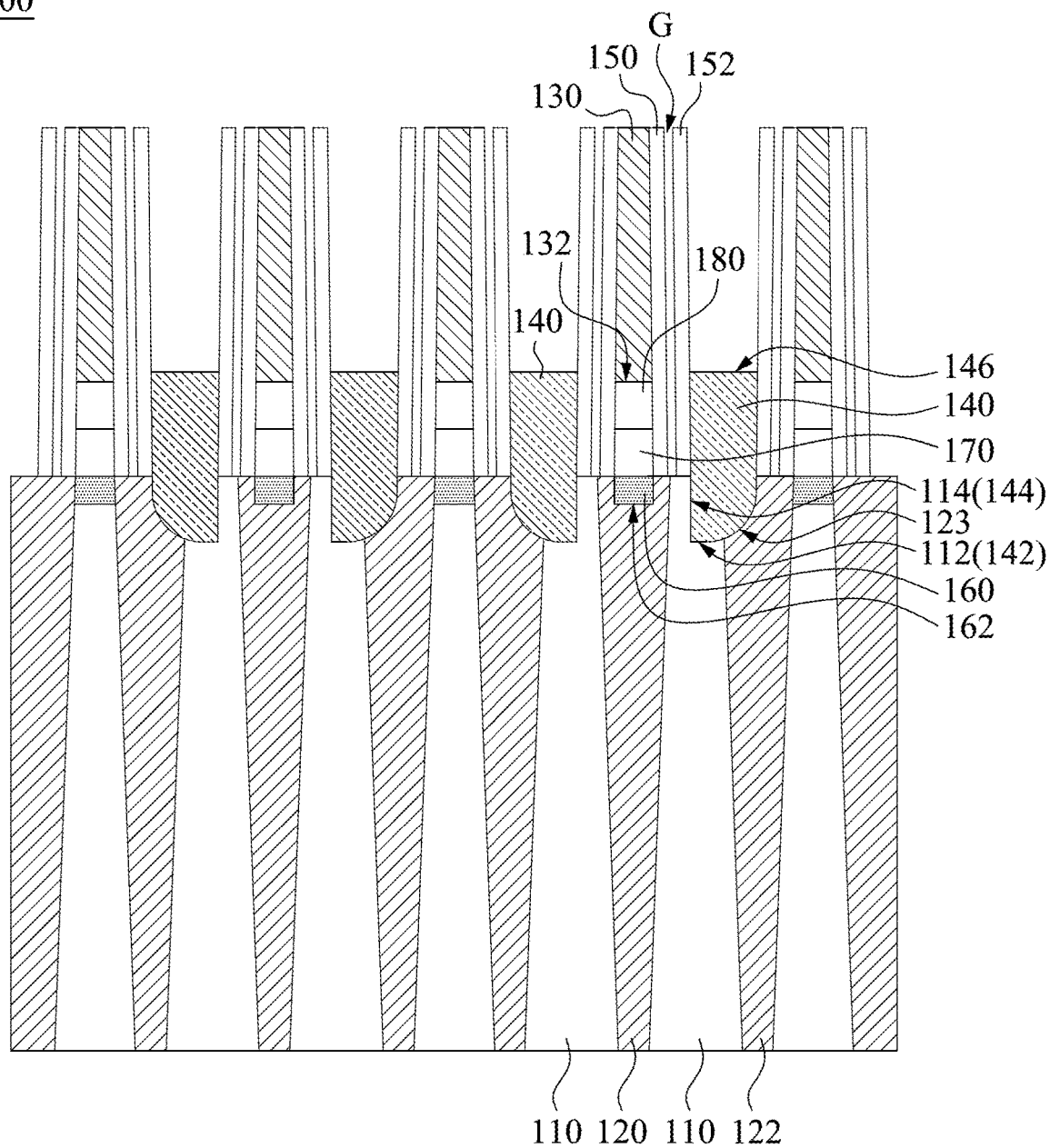
FIG. 2 is a cross-sectional view of the semiconductor structure taken along line 2-2 of FIG. 1.
Figure 3:
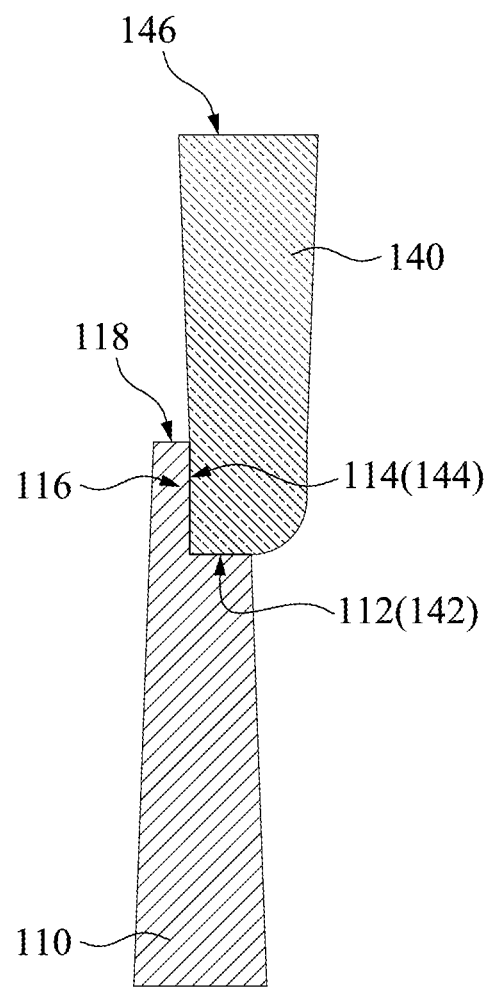
FIG. 3 is a partially enlarged view of FIG. 2.

FIG. 1 is a top view of a semiconductor structure 100 in accordance with some embodiments of the present disclosure, FIG. 2 is a cross-sectional view of the semiconductor structure 100 taken along line 2-2 of FIG. 1, and FIG. 3 is a partially enlarged view of FIG. 2. Referring to FIG. 1 to FIG. 3, the semiconductor structure 100 includes a pair of active regions 110, a first isolation structure 120, a gate structure 130, and a pair of contacts 140. The first isolation structure 120 is disposed between the active regions 110. The gate structure 130 is disposed on the first isolation structure 120. The contacts 140 are respectively disposed on the active regions 110. The contacts 140 may be electrically connected to conductive components, such as capacitors. Each of the contacts 140 has a bottom surface 142 and a sidewall 144 substantially perpendicular to the bottom surface 142. As a result of such a configuration, higher growth rate of the contacts 140 can be achieved and the contacts 140 can be uniformly formed on the active regions 110. Thus, high through-put of the contacts 140 can be achieved and the performance of the semiconductor structure 100 can be improved.

In some embodiments, an angle between the bottom surface 142 and the sidewall 144 of each of the contacts 140 is approximately 90 degrees. In some embodiments, the sidewalls 144 and the bottom surfaces 142 of the contacts 140 have crystal orientations <100>. The crystal orientations <100> are beneficial to increase growth rate and the growth uniformity of the contacts 140. As a result, the through-put of the contacts 140 can be increased.

In some embodiments, the contacts 140 are respectively in contact with the active regions 110. In greater details, the contacts 140 protrude upwardly from the active regions 110.

In some embodiments, the active region 110 has a top surface 112 and a sidewall 114 substantially perpendicular to the top surface 112. The bottom surface 142 and the sidewall 144 of the contact 140 are respectively conformal with the top surface 112 and the sidewall 114 of the active region 110. In other words, the bottom surface 142 of the contact 140 and the top surface 112 of the active region 110 are at same horizontal level, and the sidewall 144 of the contact 140 and the sidewall 114 of the active region 110 face each other.

In some embodiments, the semiconductor structure 100 further includes a second isolation structure 122. One of the active regions 110 is disposed between the first isolation structure 120 and the second isolation structure 122, and the second isolation structure 122 has a curved top surface 123 adjoining the top surface 112 of the active region 110. In some embodiments, the contact 140 is in contact with the active region 110 and the second isolation structure 122.

In some embodiments, the semiconductor structure 100 further includes a first spacer 150 and a second spacer 152 that are between the gate structure 130 and one of the contacts 140, in which the first spacer 150 and the second spacer 152 have a gap G. The gap G is disposed between the first spacer 150 and the second spacer 152. In some embodiments, the first spacer 150 is disposed on the first isolation structure 120, while the second spacer 152 is disposed on the active region 110 next to the first isolation structure 120. In greater details, the first spacer 150 and the second spacer 152 are respectively in contact with the first isolation structure 120 and the active region 110.

In some embodiments, the semiconductor structure 100 further includes a bit line contact 160, a dielectric structure 170, and a metal structure 180. The bit line contact 160 is disposed below the gate structure 130. The dielectric structure 170 is disposed between the bit line contact 160 and the gate structure 130. The metal structure 180 is disposed between the dielectric structure 170 and the gate structure 130. In some embodiments, the first spacer 150 is in contact with the gate structure 130, the metal structure 180, the dielectric structure 170, and the first isolation structure 120, while the second spacer 152 is in contact with the contact 140 and the active region 110.

In some embodiments, a top surface 146 of the contact 140 is higher than a bottom surface 132 of the gate structure 130. In some embodiments, the bottom surfaces 142 of the contacts 140 are lower than a bottom surface 162 of the bit line contact 160. In some embodiments, the top surface 146 of the contact 140 is at same horizontal level.

In some embodiments, as shown in FIG. 3, the active region 110 has a top portion 116 with a step profile, and the bottom surfaces 142 of the contacts 140 are lower than top surfaces 118 of the top portions 116 of the active regions 110.

In the present embodiment, the gate structure 130 may serve as a bit line (BL). In addition, as shown in FIG. 1, the semiconductor structure 100 further includes a word line 190. A lengthwise direction of the word line 190 is perpendicular to a lengthwise direction of the gate structure 130 (i.e., the bit line).

In some embodiments, the active regions 110 may include silicon. In some embodiments, the first isolation structure 120 and the second isolation structure 122 may be made of silicon oxide, silicon nitride or silicon oxynitride, or other suitable materials. The first isolation structure 120 and the second isolation structure 122 may be shallow trench isolation (STI) structures. In some embodiments, the gate structure 130 may include a conductive material such as tungsten or other suitable conductive materials. The gate structure 130 may be made of a material different from a material of the metal structure 180. In some embodiments, the contacts 140 may be made of a material including doped polysilicon. The contacts 140 may include phosphorus dopants.

Figure 4:
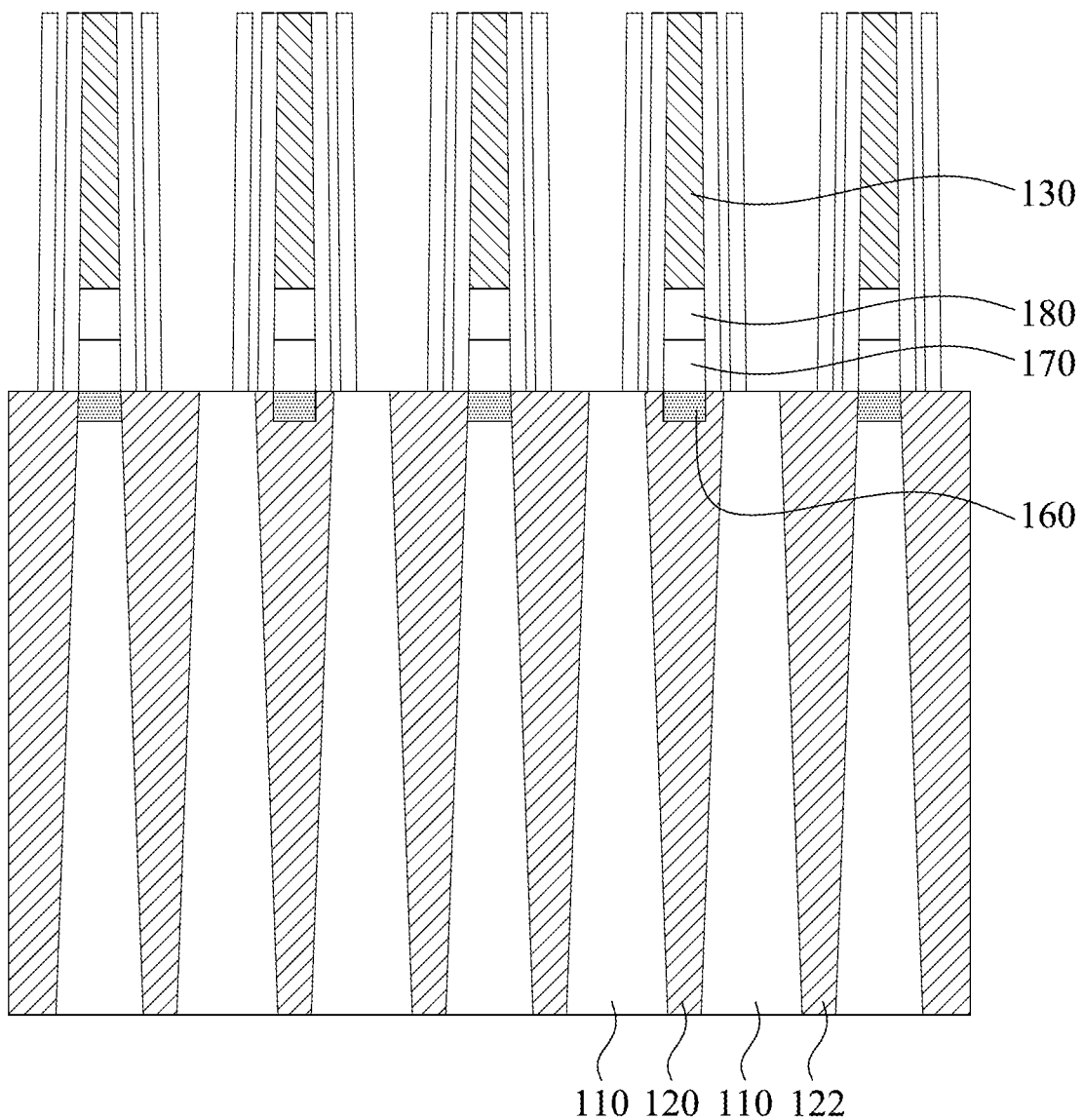
FIG. 4, FIG. 5, and FIG. 7 are cross-sectional views of a method of forming a semiconductor structure at various stages in accordance with one embodiment of the present disclosure.
Figure 5:
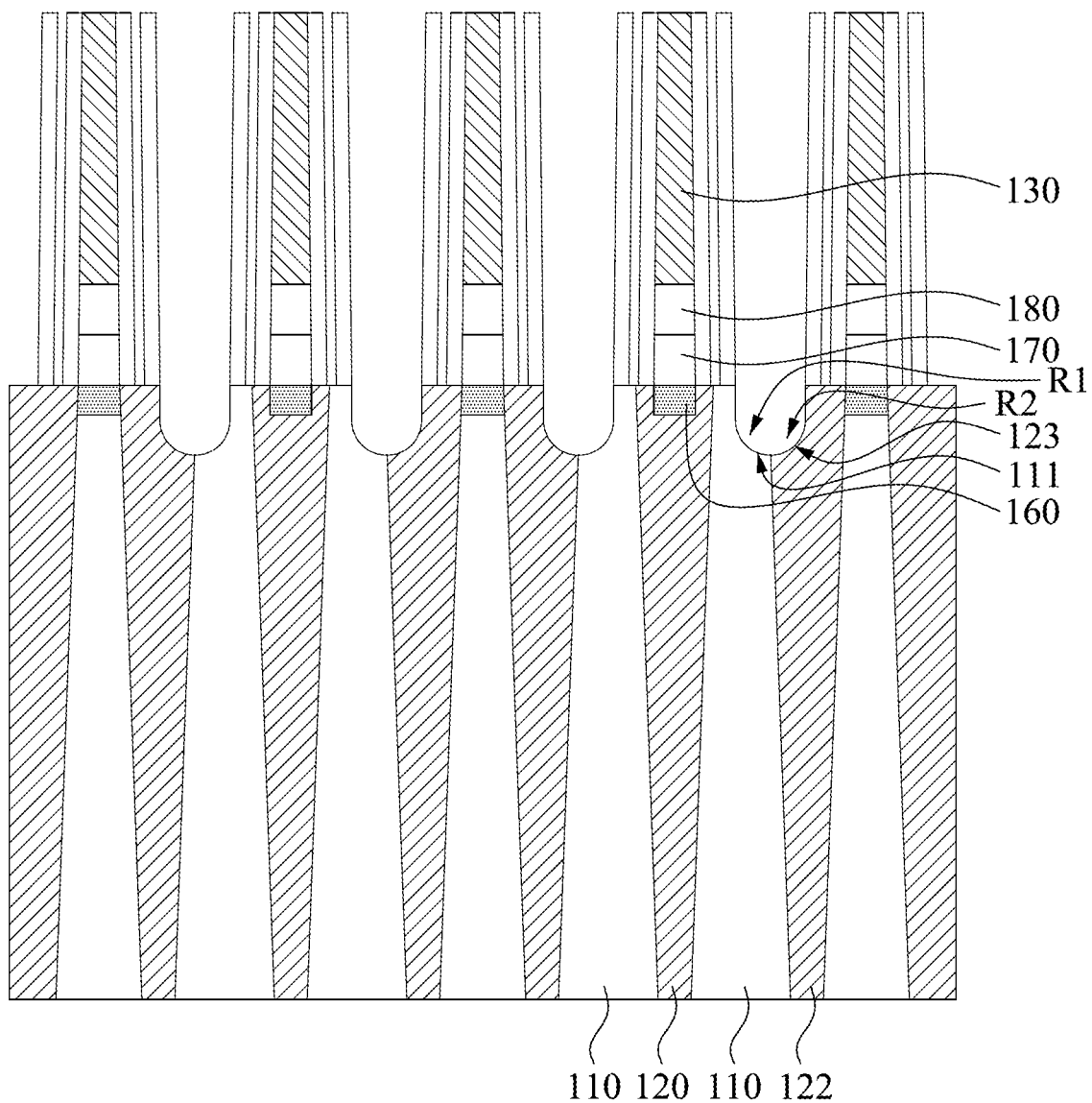
Figure 7:
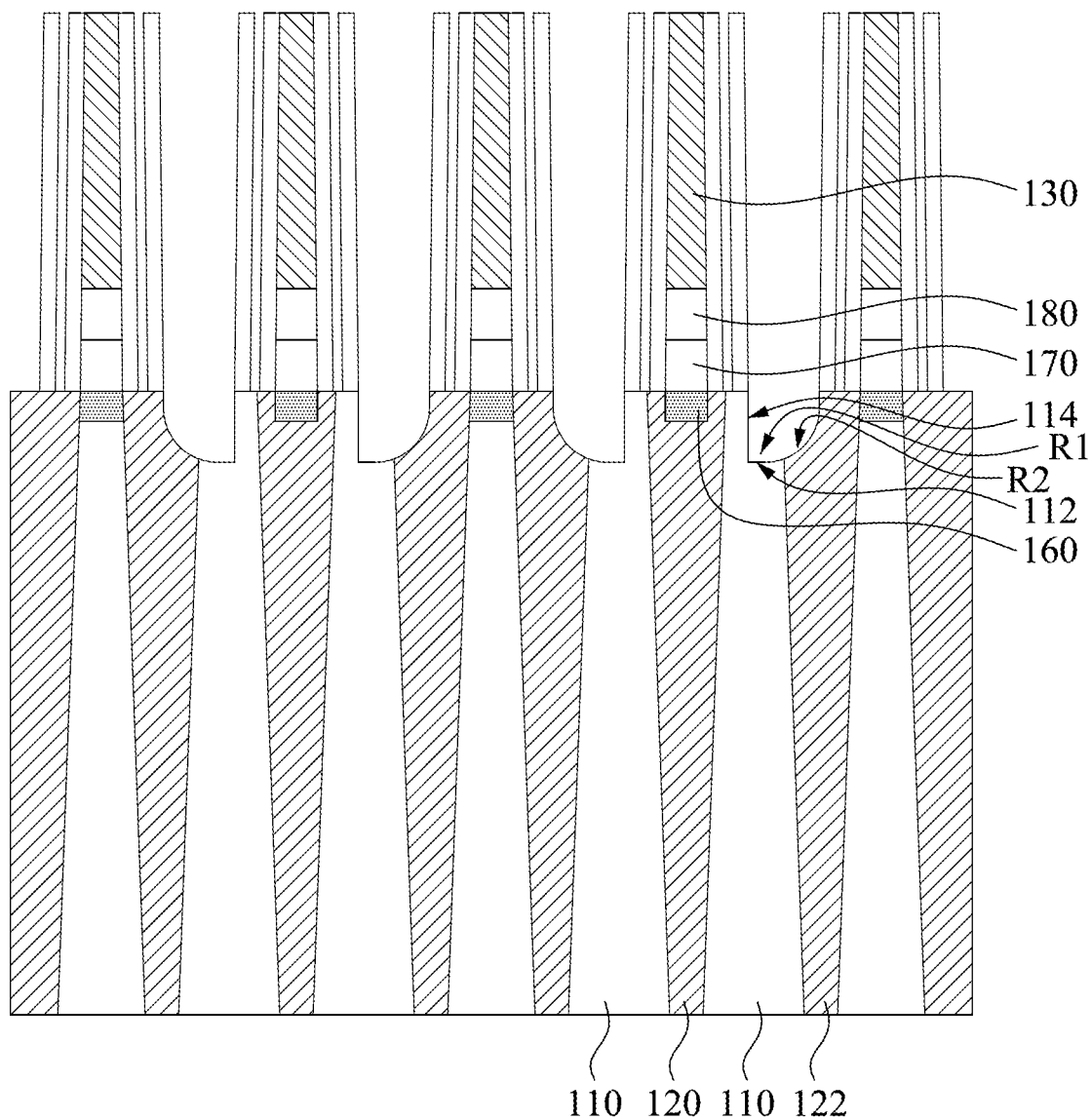

FIG. 4, FIG. 5, and FIG. 7 are cross-sectional views of a method of forming the semiconductor structure 100 of FIG. 2 at various stages in accordance with some embodiments of the present disclosure.

Referring to FIG. 4, the first isolation structure 120 is formed between the pair of active regions 110. In greater details, the second isolation structure 122 is formed such that one of the active regions 110 is between the first isolation structure 120 and the second isolation structure 122. The first isolation structure 120 and the second isolation structure 122 may be formed by physical vapor deposition (PVD), chemical vapor deposition (CVD), or the like. After the first isolation structure 120 is formed, the gate structure 130 is formed on the first isolation structure 120.

Figure 6:
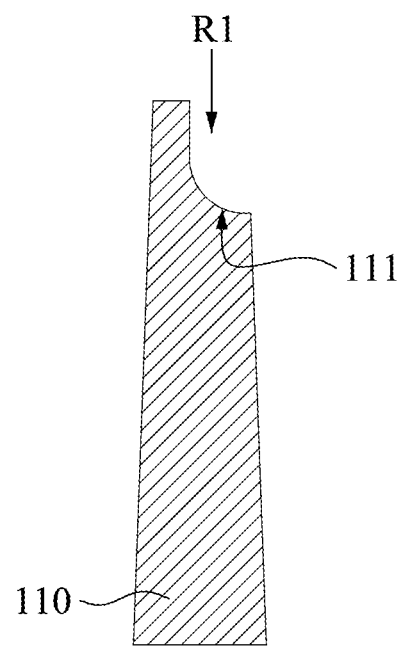
FIG. 6 is a partially enlarged view of FIG. 5.

FIG. 6 is a partially enlarged view of FIG. 5. Referring to FIG. 5 and FIG. 6, after the gate structure 130 is formed, the active region 110 is etched to form a recess R1, such that the active region 110 has the curved top surface 111. Moreover, the second isolation structure 122 is etched such that the second isolation structure 122 has a recess R2, such that second isolation structure 122 has another curved top surface 123 next to the curved top surface 111. In some embodiments, the recess R2 of the second isolation structure 122 directly connects to the recess R1 of the active region 110. The curved top surface 123 of the second isolation structure 122 adjoins the curved top surface 111 of the active region 110.

In some embodiments, etching the active region 110 and the second isolation structure 122 to form the recesses R1 and R2 is performed by a dry etching process. In some embodiments, a dry etchant, such as H2 and N2, may be selected for the dry etching process.

Figure 8:
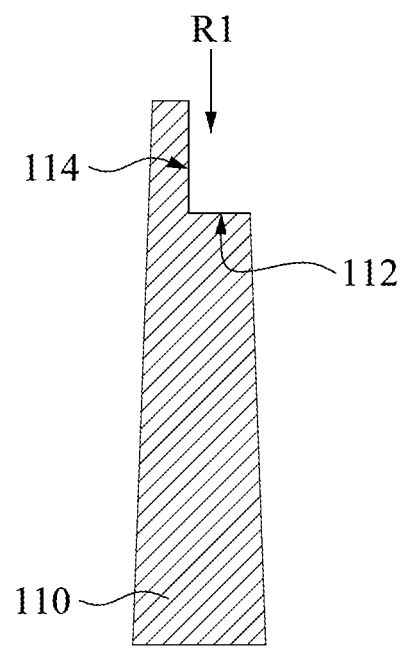
FIG. 8 is a partially enlarged view of FIG. 7.
Figure 9:
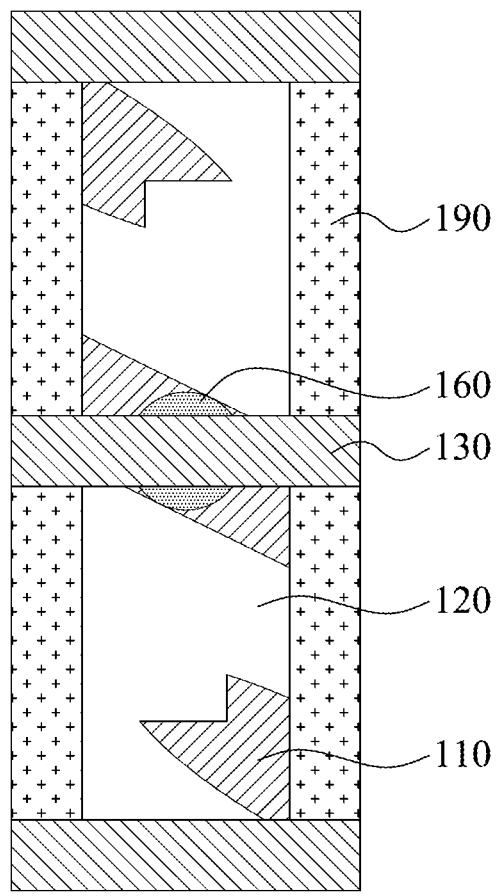
FIG. 9 is a top view of FIG. 7.

FIG. 8 is a partially enlarged view of FIG. 7, and FIG. 9 is a top view of FIG. 7. Referring to FIG. 7 to FIG. 9, after the active regions 110 are etched to form the recess R1 with curved top surfaces 111 shown in FIG. 5, the active regions 110 are etched again to change each of the curved top surfaces 111 to be the top surface 112 and the sidewall 114 substantially perpendicular to the top surface 112. In other words, the recess R1 in FIG. 5 is laterally and vertically expanded such that the top surface 112 and the sidewall 114 of the active region 110 are substantially perpendicular to each other. In some embodiments, the active region 110 is etched again, while the second isolation structure 122 is not etched. In other word, the recess R1 is expanded, while the recess R2 is unchanged.

In some embodiments, etching the active regions 110 again to change each of the curved top surfaces 111 is performed by a wet etching process. In some embodiments, a wet etchant, such as NH$_4$OH, may be selected for the wet etching process. In some embodiments, the etchant used in the etching process as shown in FIG. 7 is different from the etchant used in the etch process as shown in FIG. 5.

In some embodiments, after the active regions 110 is etched again, a clean treatment is performed on the top surfaces 112 and the sidewalls 114 of the active regions 110 to remove the residue particles generated from the etching processes in FIG. 5 and FIG. 7. In some embodiments, a clean solution (etchant), such as NH$_4$OH:H$_2$O$_2$:H$_2$O (APM), diluted HF (DHF), may be selected for the clean treatment. Accordingly, particles generated from the etching process can be reduced and then the through-put of the contact 140 formed in the recesses R1 and R2 in a following process can be increased.

After the active regions 110 is etched again, the contacts 140 are respectively formed on the active regions 110, such that each of the contacts 140 has the bottom surface 142 and the sidewall 144 substantially perpendicular to the bottom surface 142. As a result, the semiconductor structure 100 shown in FIG. 2 can be obtained. In some embodiments, the method of forming the contacts 140 on the active regions 110 may include filling conductive materials in the recesses R1 and R2 of FIG. 7 and then performing an etch-back operation.

In summary, because the semiconductor structure includes the active regions, the first isolation structure, the gate structure, and the contacts, and each of the contacts has the bottom surface and the sidewall substantially perpendicular to the bottom surface, higher growth rate of the contacts can be achieved and the contacts can be uniformly formed on the active regions. As a result, high through-put of the contacts can be achieved and the performance of the semiconductor structure can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
a pair of active regions, wherein each of the active regions has a top surface and a sidewall substantially perpendicular to the top surface;
a first isolation structure between the active regions;
a gate structure on the first isolation structure; and
a pair of contacts respectively on the active regions, wherein each of the contacts has a bottom surface and a sidewall substantially perpendicular to the bottom surface.

2. The semiconductor structure of claim 1, wherein the contacts are respectively in contact with the active regions.

3. The semiconductor structure of claim 1, wherein the bottom surface and the sidewall of each of the contacts are respectively conformal with the top surface and the sidewall of each of the active regions.

4. The semiconductor structure of claim 1, further comprising:
a second isolation structure, wherein one of the active regions is between the first and second isolation structures, and the second isolation structure has a curved top surface adjoining the top surface of one of the active regions.

5. The semiconductor structure of claim 1, further comprising:
a first spacer and a second spacer between the gate structure and one of the contacts; and
a gap between the first spacer and the second spacer.

6. The semiconductor structure of claim 5, wherein the second spacer is on one of the active regions.

7. The semiconductor structure of claim 1, further comprising:
a bit line contact below the gate structure;
a dielectric structure between the bit line contact and the gate structure; and
a metal structure between the dielectric structure and the gate structure.

8. The semiconductor structure of claim 7, wherein the bottom surfaces of the contacts are lower than a bottom surface of the bit line contact.

9. The semiconductor structure of claim 1, wherein a top surface of each of the contacts is higher than a bottom surface of the gate structure.

10. The semiconductor structure of claim 1, wherein each of the active regions has a top portion with a step profile, and the bottom surfaces of the contacts are lower than top surfaces of the top portions of the active regions.

11. The semiconductor structure of claim 1, wherein the sidewalls and the bottom surfaces of the contacts have crystal orientations <100>.

12. The semiconductor structure of claim 1, wherein the contacts comprise phosphorus dopants.

\* \* \* \* \*